US008865543B2

(12) United States Patent
Huang et al.

(10) Patent No.: US 8,865,543 B2
(45) Date of Patent: Oct. 21, 2014

(54) GE-BASED NMOS DEVICE AND METHOD FOR FABRICATING THE SAME

(75) Inventors: Ru Huang, Beijing (CN); Zhiqiang Li, Beijing (CN); Xia An, Beijing (CN); Yue Guo, Beijing (CN); Xing Zhang, Beijing (CN)

(73) Assignee: Peking University, Beijing (CN)

( * ) Notice: Subject to any disclaimer, the term of this patent is extended or adjusted under 35 U.S.C. 154(b) by 0 days.

(21) Appl. No.: 13/580,971

(22) PCT Filed: Feb. 21, 2012

(86) PCT No.: PCT/CN2012/071390
§ 371 (c)(1),
(2), (4) Date: Aug. 24, 2012

(87) PCT Pub. No.: WO2012/174871
PCT Pub. Date: Dec. 27, 2012

(65) Prior Publication Data
US 2014/0117465 A1    May 1, 2014

(30) Foreign Application Priority Data

Jun. 23, 2011 (CN) .......................... 2011 1 0170991

(51) Int. Cl.
*H01L 21/8242* (2006.01)
*H01L 29/78* (2006.01)
*H01L 29/66* (2006.01)
*H01L 29/51* (2006.01)

(52) U.S. Cl.
CPC .............. *H01L 29/517* (2013.01); *H01L 29/78* (2013.01); *H01L 29/66477* (2013.01)
USPC ........... 438/241; 438/197; 438/169; 438/672; 257/E21.006; 257/E21.047; 257/E21.17; 257/E21.168; 257/E21.173; 257/E21.229; 257/E21.245; 257/E21.267; 257/E21.278; 257/E21.293; 257/E21.458

(58) Field of Classification Search
USPC ......... 438/197, 199, 169, 241, 672, 675, 680, 438/668, 706, 752, 754, 769; 257/288, 310, 257/E21.006, E21.047, E21.168, E21.17, 257/E21.173, E21.229, E21.245, E21.267, 257/E21.278, E21.293, E21.458
See application file for complete search history.

(56) References Cited

U.S. PATENT DOCUMENTS 6,235,568 B1 *  5/2001  Murthy et al. ................ 438/231
6,782,610 B1 *  8/2004  Iijima et al. .................... 29/827

(Continued)

FOREIGN PATENT DOCUMENTS

CN           1886826 A      12/2006
CN         101866953 A      10/2010

(Continued)

OTHER PUBLICATIONS

International Search Report in International Application No. PCT/CN2012/071390, dated May 24, 2012 in Chinese.

*Primary Examiner* — David Nhu
(74) *Attorney, Agent, or Firm* — Park, Kim & Suh, LLC

(57) ABSTRACT

The embodiments of the present invention provide a Ge-based NMOS device structure and a method for fabricating the same. By using the method, double dielectric layers of germanium oxide ($GeO_2$) and metal oxide are deposited between the source/drain region and the substrate. The present invention not only reduces the electron Schottky barrier height of metal/Ge contact, but also improves the current switching ratio of the Ge-based Schottky and therefore, it will improve the performance of the Ge-based Schottky NMOS transistor. In addition, the fabrication process is very easy and completely compatible with the silicon CMOS process. As compared with conventional fabrication method, the Ge-based NMOS device structure and the fabrication method in the present invention can easily and effectively improve the performance of the Ge-based Schottky NMOS transistor.

9 Claims, 5 Drawing Sheets

(56) References Cited

U.S. PATENT DOCUMENTS

| | | | |
|---|---|---|---|
| 7,842,612 B2 * | 11/2010 | Nemouchi | 438/677 |
| 8,183,141 B2 * | 5/2012 | Hyun et al. | 438/591 |
| 8,253,177 B2 * | 8/2012 | Yu et al. | 257/288 |
| 8,470,666 B2 * | 6/2013 | Mouli | 438/238 |
| 2007/0026591 A1 | 2/2007 | Grupp et al. | |

FOREIGN PATENT DOCUMENTS

| | | |
|---|---|---|
| CN | 102227001 A | 10/2011 |
| EP | 1763084 A2 | 3/2007 |
| JP | 2003-017705 A | 1/2003 |
| JP | 2005-026563 A | 1/2005 |

* cited by examiner

GE-BASED NMOS DEVICE AND METHOD FOR FABRICATING THE SAME

CROSS-REFERENCES TO RELATED APPLICATION

The present application is the National Phase of PCT/CN2012/071390 filed on Feb. 21, 2012, which claims priority under 35 U.S.C. 119(a) to Chinese Patent Application (application number No. 201110170991.4), filed to State Intellectual Property Office of China on Jun. 23, 2011, all of which are incorporated herein by reference in its entirety.

FIELD OF THE INVENTION

The present invention relates to the field of the ultra large scaled integrated circuit (ULSI) fabrication technologies, and in particular, to a structure of a germanium-based NMOS device and a method for fabricating the same.

BACKGROUND OF THE INVENTION

Under the Moore Law, the integration density of conventional Si-based MOS device is continually raised, while it is also faced various challenge and limitation, such as, mobility degradation, carrier velocity saturation and DIBL effect and so on, in which the mobility degradation becomes one of the critical factors affecting the of further improvement of device performance. In order to solve these problems resulting from the scaling down of the device, it is necessary to use a channel material with a high mobility. At present, Ge-based Schottky MOS transistor becomes one of the hot research focuses. Firstly, the electron and hole mobility of the Ge material are higher than that of silicon material, and the fabrication process of the Ge channel device is compatible with the conventional CMOS process. Secondly, the substitution of the conventional highly doped source/drain with a Schottky source/drain structure not only avoids the problems of low solid solubility and rapid diffusion of impurities in the Ge material, but also decreases resistances of the source/drain. Therefore, the Ge-based Schottky MOS transistor is promising to break the limitation of the conventional Si-based device, and thus an excellent device performance can be obtained.

However, the Ge-based Schottky MOS transistor also has some problems to be solved. There are a large number of dangling bonds at the interface between the source/drain and a substrate of the Ge-based schottky MOS transistor, and the Fermi energy level is pinned at the vicinity of the valence band due to a Metal-Induced Gap State (MIGS) generated by metal (or metal germanide) in the Ge forbidden band, leading to a high electron barrier. The high electron barrier severely limits the improvement of the performance of the Ge-based Schottky MOS transistor. A higher barrier of the source/channel in on-state limits a current drive ability of the device, and a lower barrier of the source/channel in off-state leads to increasing of a leakage current of the device. Meanwhile, the high electron barrier causes the electrons enter into the channel mainly by means of tunneling, so that a subthreshold slope of the device is increased. Therefore, the electron barrier height becomes one of the critical factors affecting the performance of the Ge-based Schottky NMOS transistor.

SUMMARY OF THE INVENTION

For the above-mentioned problems of the Ge-based Schottky NMOS transistor, the embodiments of the present invention, by depositing a double-layer dielectric thin film formed by germanium oxide ($GeO_2$) and metal oxide between the source/drain region and the substrate, can alleviate the Fermi level pinning effect, decrease the electron barrier, and improve the performance of the Ge-based Schottky NMOS transistor.

A method for fabricating a Ge-based Schottky NMOS transistor of an embodiment of the present invention is briefly described below. The method includes the following steps:

1-1) fabricating a MOS structure over a Ge-based substrate;

1-2 depositing a $GeO_2$ thin layer and a metal oxide thin layer in source/drain regions;

1-3) sputtering a metal thin film with a low work function, etching the metal thin film to form a metal source/drain; and 1-4) forming a contact hole and a metal line.

The step 1-1) particularly includes:

2-1) fabricating an isolation region over the substrate;

2-2) depositing a gate dielectric layer and forming a gate;

2-3) forming a gate structure; and 2-4) forming a sidewall structure.

In the step 1-1), the Ge-based substrate includes a bulk Ge substrate, a Ge-on-insulator or an epitaxial Ge substrate or the like.

In the step 1-2), the metal oxide is a material with a low areal density of oxygen, and it is required that the ratio between the areal density of oxygen of the dielectric material and that of $GeO_2$ is less than 0.8, and the dielectric material may be strontium oxide (SrO), barium oxide (BaO), radium oxide (RaO) or the like.

In the step 1-3), the metal film is an aluminum film or other metal film with low work function.

As compared with the conventional technology, the embodiments of the present invention bring about the following beneficial effects.

The method can alleviate the Fermi level pinning effect, reduce the electron barrier, and hence improve the performance of Ge-based Schottky NMOS device. Firstly, a thin layer of metal oxide is deposited over the $GeO_2$. As the areal density of oxygen of the metal oxide is lower than that of the $GeO_2$, the oxygen atoms at the interface of the $GeO_2$ move toward the interface of the metal oxide, then result in interface dipoles with pointing from the $GeO_2$ to the metal oxide, which is advantageous to modulate the Schottky electron barrier. Secondly, among many dielectric materials, $GeO_2$ and Ge substrate can form a better interface contact, with effectively passivating the dangling bonds at the Ge surface, and reducing the density of interface states. Thirdly, the metal oxide and $GeO_2$ between the metal source/drain and the substrate can block the Metal-Induced Gap States (MIGS) resulted by metal or the metal germanide, which can further alleviate the Fermi level pinning effect and be beneficial to reducing the electron Schottky barrier height.

Generally, the smaller the ratio between the areal density of oxygen of the metal oxide and that of the $GeO_2$ is, the stronger the generated dipoles are, and thus the more significant the modulation of the Schottky barrier is. Moreover, the areal density of oxygen of the metal oxide is related to the radius of the metallic cation, wherein the larger the radius of the metallic cation is, the lower the areal density of oxygen is. With respect to the materials used in the embodiments of the present invention such as strontium oxide(SrO), barium oxide (BaO), radium oxide(RaO), the radius of the metallic cations are all larger than 1.1 Å, and the ratios between the areal density of oxygen of these material and that of the $GeO_2$ interface are less than 0.8, so that strong dipoles are generated to adjust the Schottky barrier. As compared with a single layer of the insulating dielectric material such as aluminum oxide ($Al_2O_3$), the embodiments of the present invention can adjust the Schottky barrier more effectively and then further improve the performance of Ge-based Schottky NMOS transistor.

Figure 1:
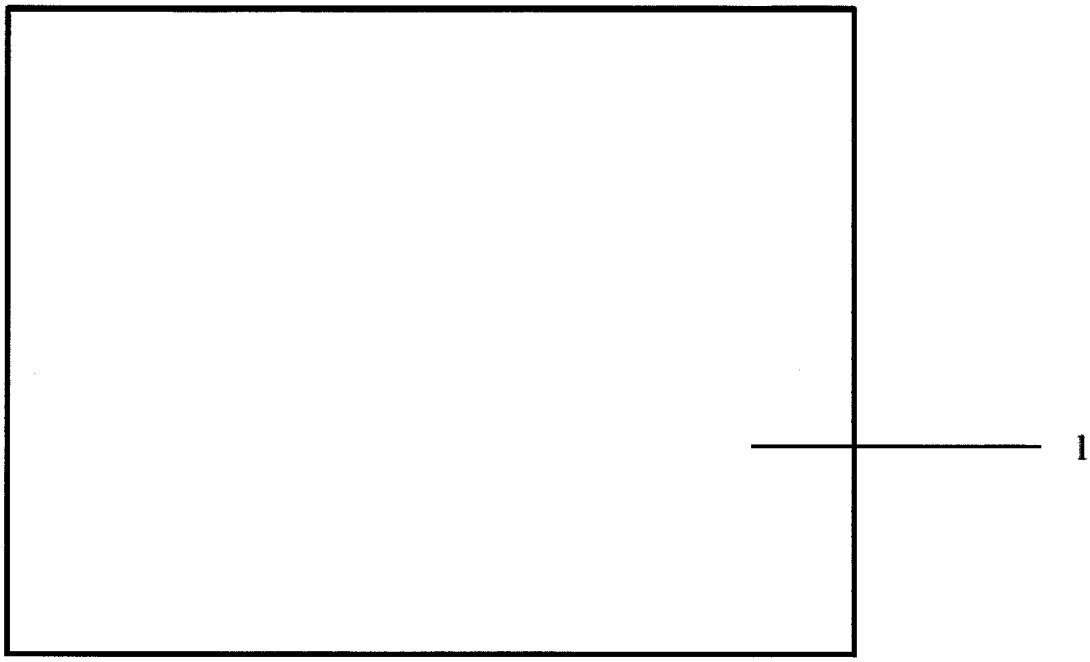
FIG. 1(a)-FIG. 1(j) are flow diagrams illustrating the fabrication of the Ge-based Schottky transistor according to an embodiment of the present invention.
Figure 1:
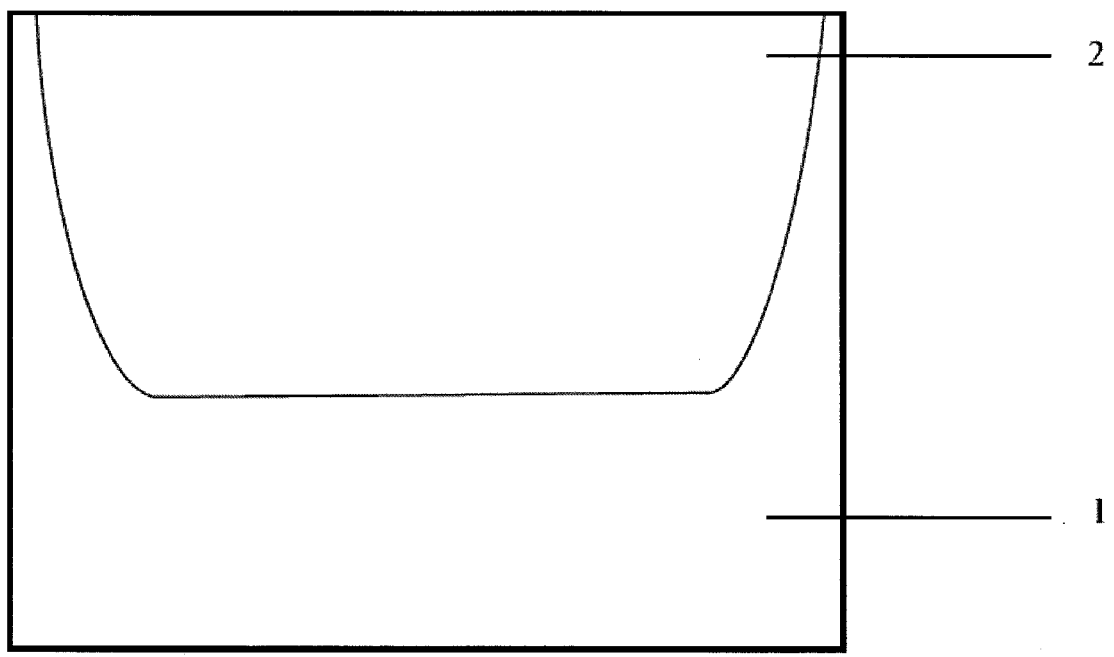
Figure 1:
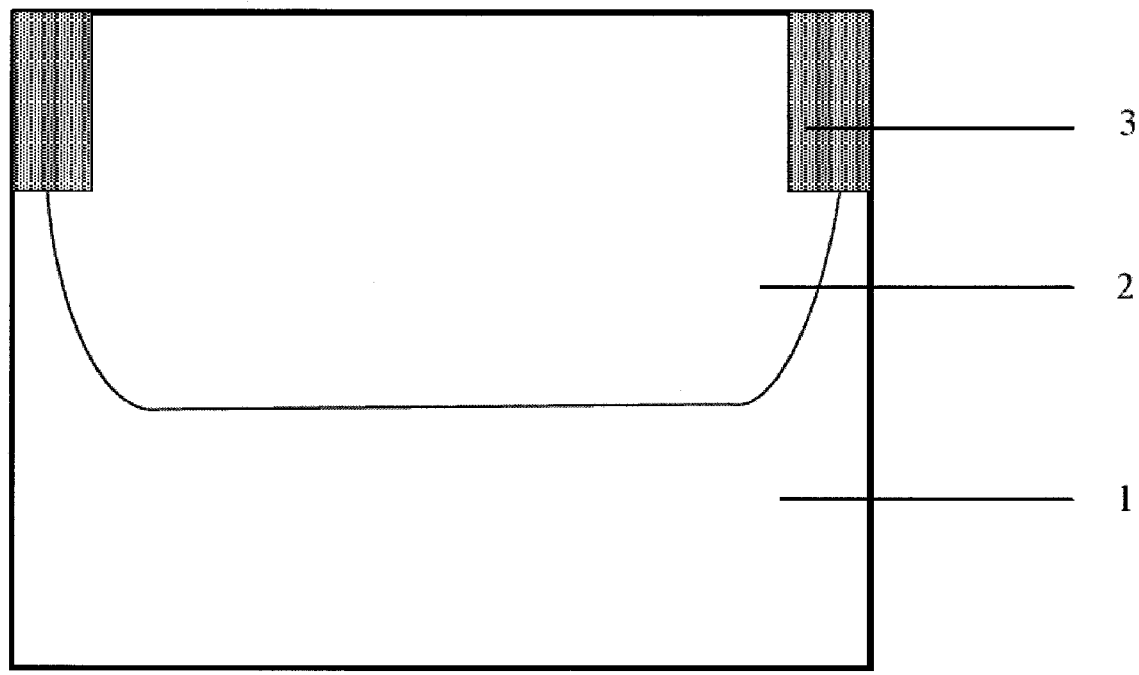
Figure 1:
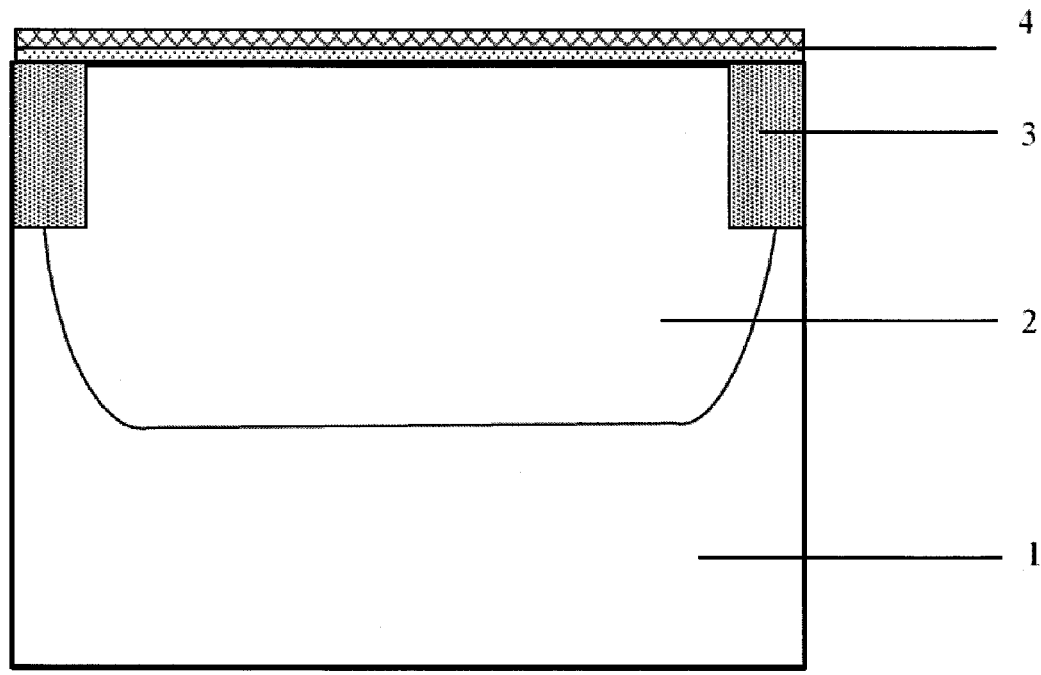
Figure 1:
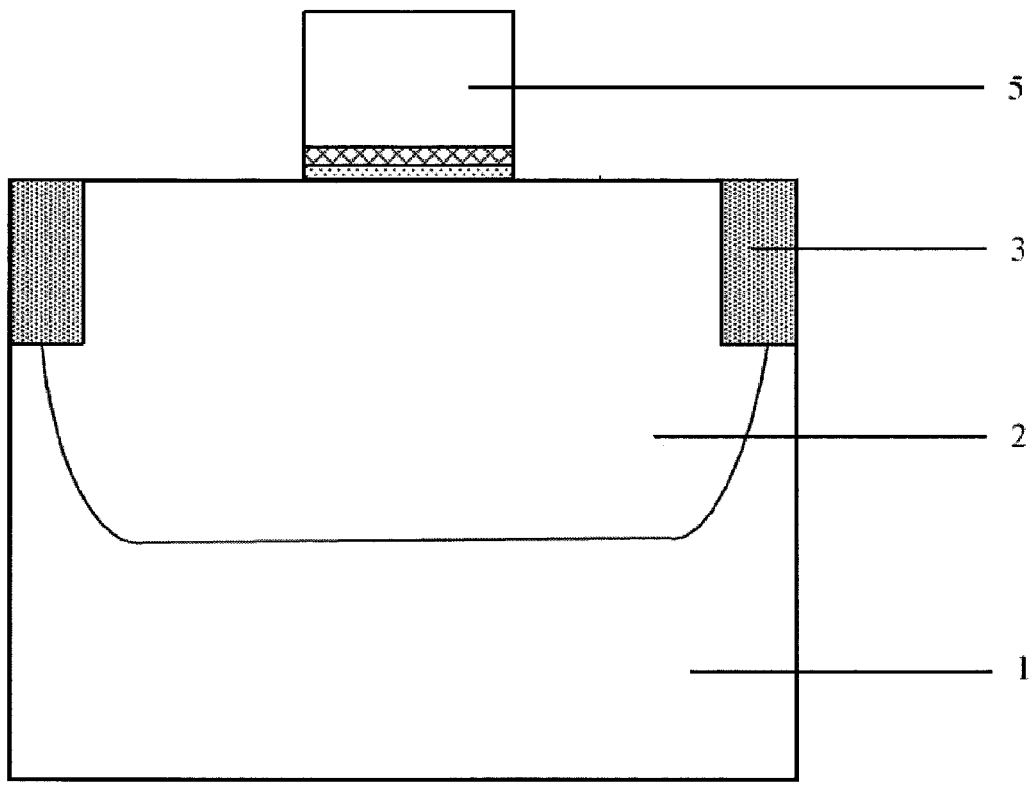
Figure 1:
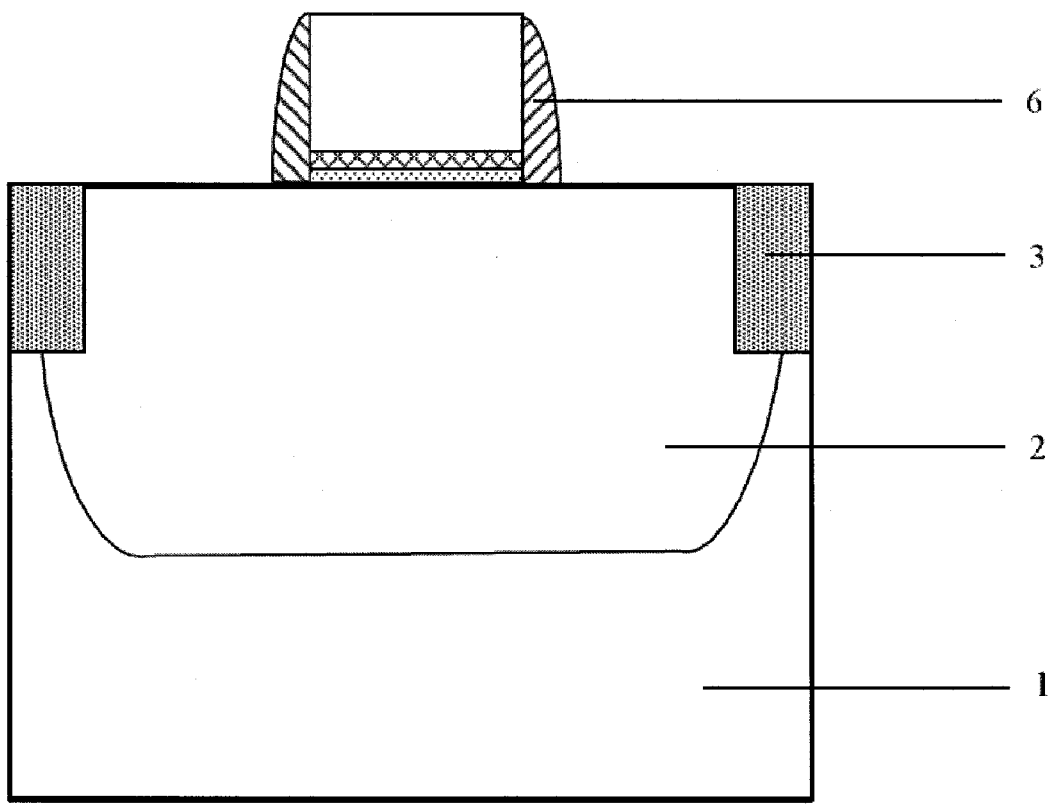
Figure 1:
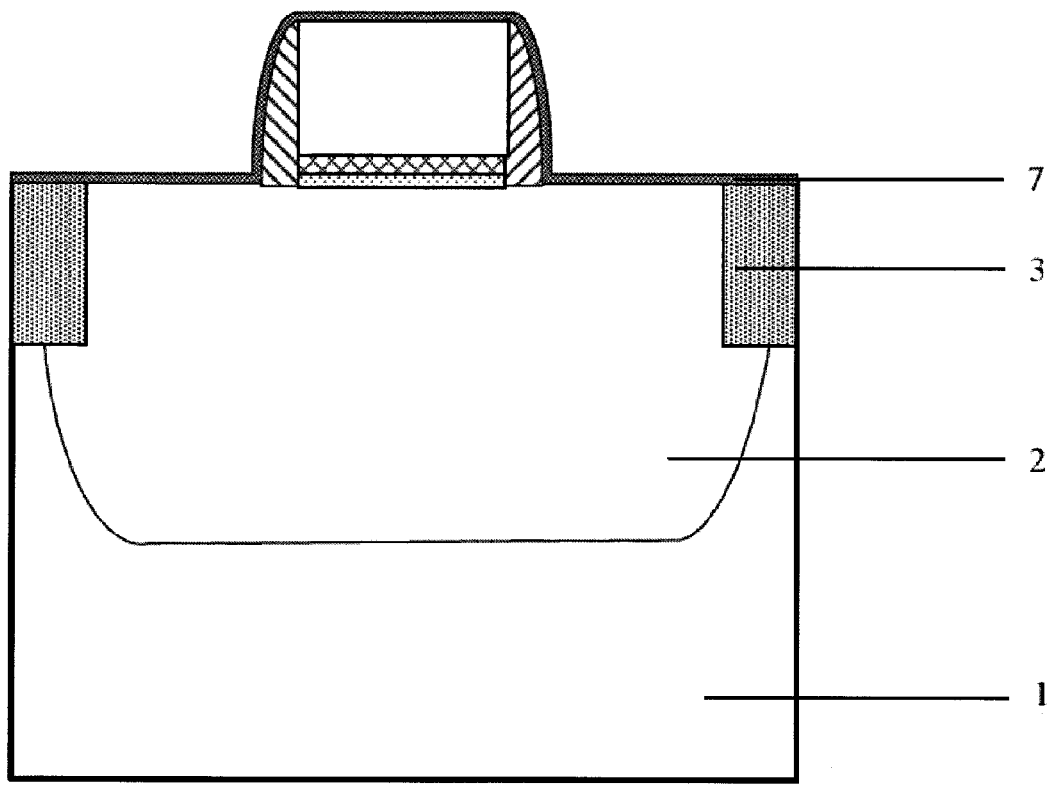
Figure 1:
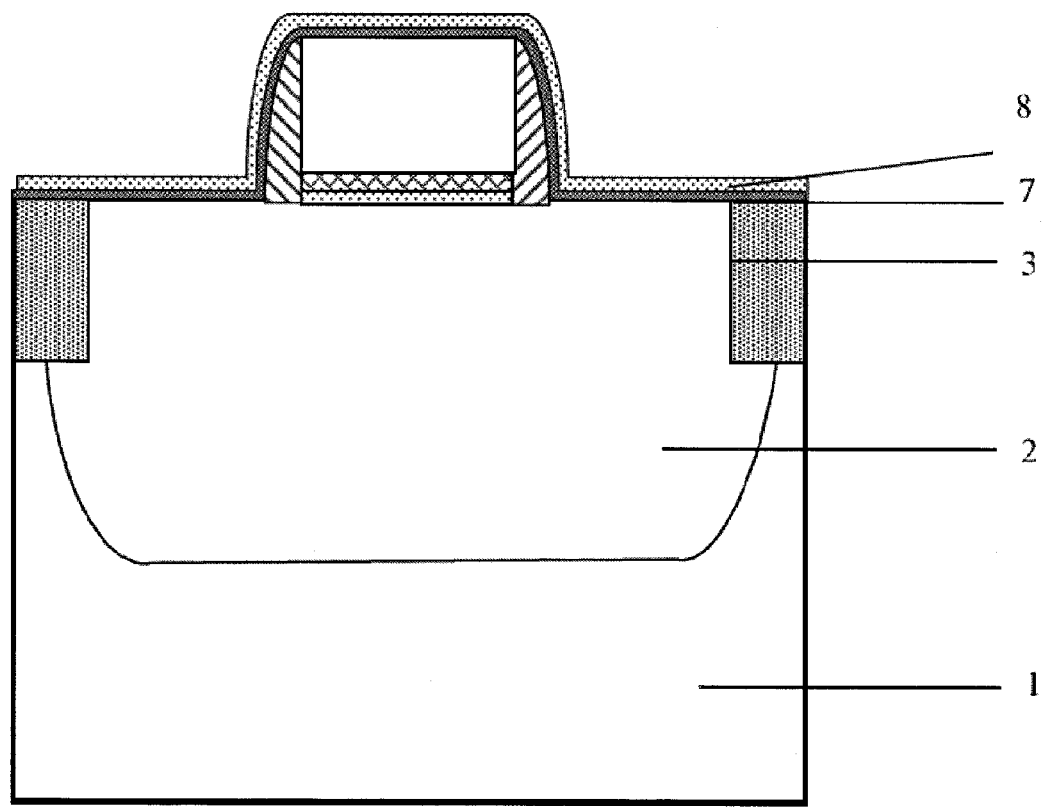
Figure 1:
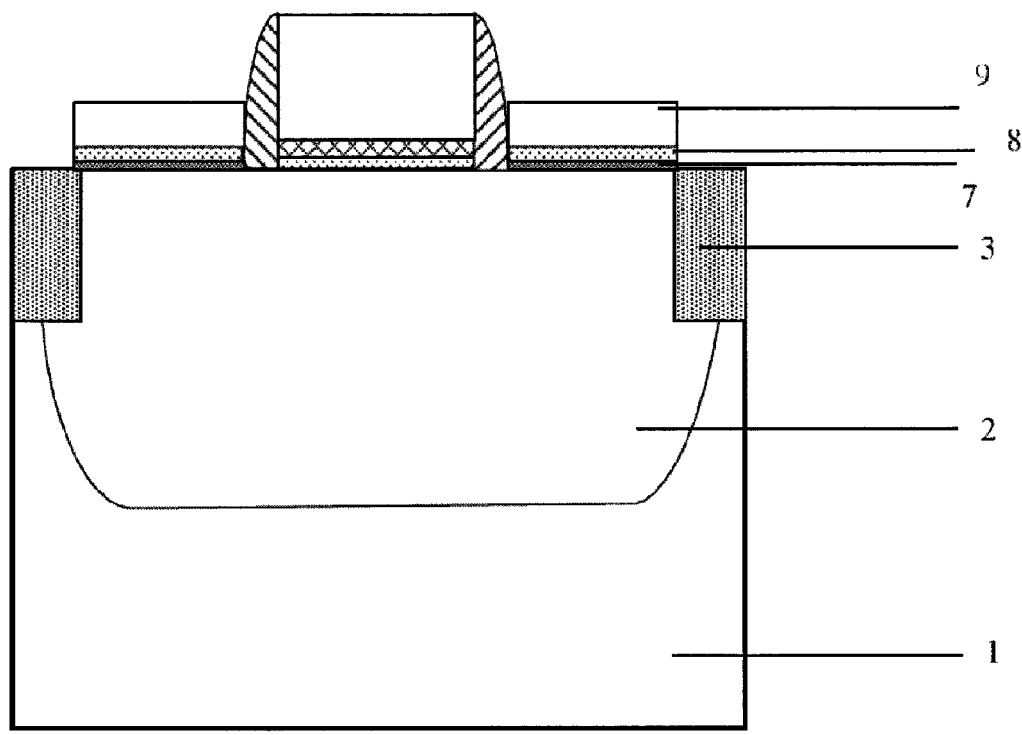
Figure 1:
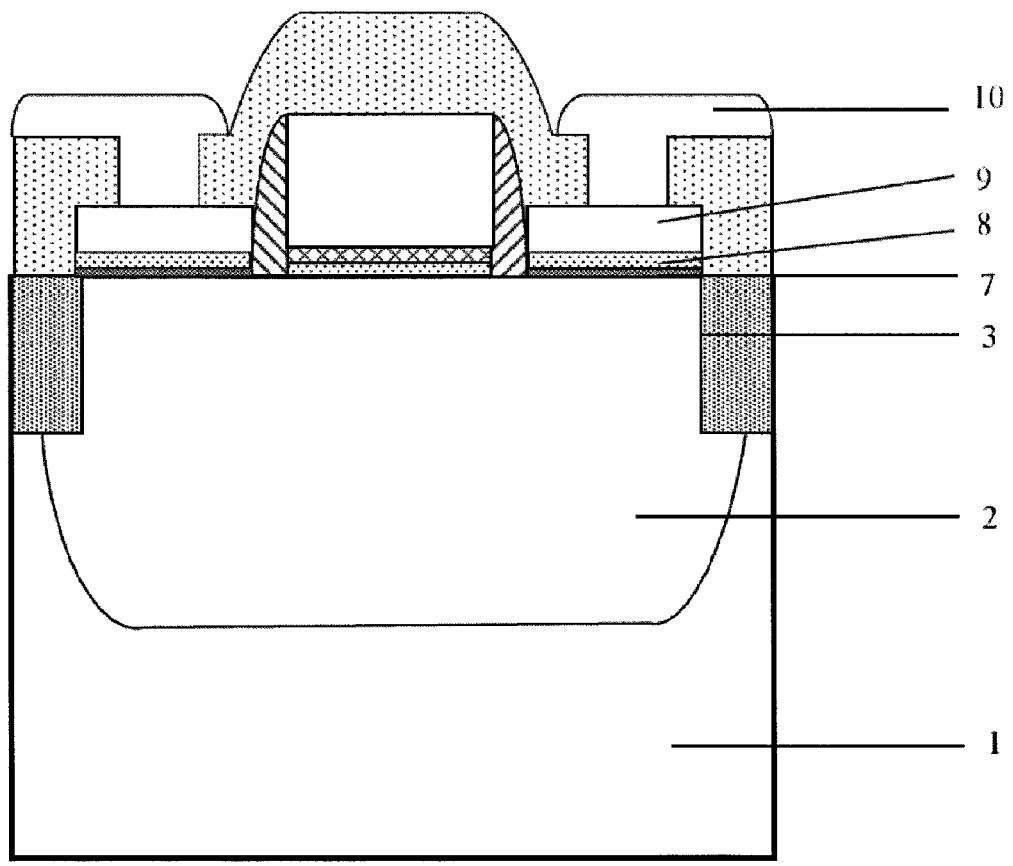

In the figures, reference sign 1 denotes a substrate, reference sign 2 denotes a P well region, reference sign 3 denotes an isolation region, reference sign 4 denotes a gate dielectric layer, reference sign 5 denotes a metal gate, reference sign 6 denotes a sidewall structure, reference sign 7 denotes a $GeO_2$ thin layer, reference sign 8 denotes an insulation oxide thin film, reference sign 9 denotes a metal source/drain, and reference sign 10 denotes a metal line layer.

DETAILED DESCRIPTION OF THE EMBODIMENTS

The embodiments of the present invention are further described below with combination of the attached drawings and specific embodiments.

FIG. 1 shows a flow of a method for fabricating the Ge-based Schottky transistor of a preferred embodiment of the present invention. The method for fabricating the Ge-based Schottky transistor of the preferred embodiment of the present invention includes the following steps:

Step 1: a Ge-based substrate is provided. As shown in FIG. 1(a), the Ge-based substrate may be an N type semiconductor Ge substrate 1, wherein, the substrate 1 may be a bulk Ge, a Ge-on-insulator (GOI) or an epitaxial Ge substrate or the like.

Step 2: a P-type well region is formed. A silicon oxide layer and a silicon nitride layer are deposited over the Ge substrate. The P type well region is firstly defined by a photolithography process and the silicon nitride in the P-typed well region is ion-reaction etched. Subsequently, P type impurities such as B are ion-implanted, and an annealing process is performed to form a P well 2. Finally, the implantation mask layer is removed, the resulting structure is shown in FIG. 1(b).

Step 3: a trench isolation is achieved. As an isolation region 3 in FIG. 3(c), a silicon oxide layer and a silicon nitride layer are firstly deposited over the Ge substrate. Subsequently, a trench is formed by defining and etching the silicon oxide layer, the silicon nitride layer and the Ge substrate using photolithography process and ion reaction etch technology. The trench is filled by depositing silicon oxide using chemical vapor deposition (CVD) method, and then the surface is polished by using a chemical mechanical polish to achieve isolation for the device. The isolation for the device is not limited to shallow trench isolation (STI), and a field oxygen isolation technology or the like may also be used.

Step 4: a gate dielectric layer is formed over an active region. The gate dielectric layer may be formed of a dielectric material with a high K constant, germanium oxide, germanium oxynitride or the like. Before the deposition of the gate dielectric layer, it is generally necessary to perform a surface passivation process by using $PH_3$, $NH_3$ and F plasma etc., or to deposit an interface layer such as a silicon (Si) layer, aluminum nitride (AlN) layer, yttrium oxide ($Y_2O_3$) layer or the like. In the preferred embodiment of the present invention, a thin yttrium oxide ($Y_2O_3$) layer is formed as an interface layer over the Ge substrate, and subsequently a hafnium oxide ($HfO_2$) gate dielectric layer 4 is formed by using an atom layer deposition (ALD) method, as shown in FIG. 1(d).

Step 5: a gate is formed over the gate dielectric layer. The gate may be a polysilicon gate, a metal gate, a FUSI gate, an entire germanide gate or the like. In the embodiment of the present invention, a metal gate is formed by depositing titanium nitride (TiN), and then a gate structure is formed by using a photolithography process and etching process, as shown in FIG. 1(e).

Step 6: sidewalls are formed at both sides of the gate. The sidewalls may be formed by depositing and etching $SiO_2$ or $Si_3N_4$, and a double sidewall structure may also be formed by successively depositing $SiO_2$ and $Si_3N_4$. As shown in FIG. 1(f), in an embodiment of the present invention, a sidewall structure 6 is formed at both sides of the gate by depositing and dry etching $SiO_2$.

Step 7: a $GeO_2$ thin layer is formed in the source/drain region. The thin layer may be obtained by using ALD, radio-frequency sputtering, thermal oxidation, ozone oxidation, and the like. Herein, it is preferable to use the ALD deposition method, and the $GeO_2$ layer has a thickness of 0.5~4 nm, as shown in FIG. 1(g).

Step 8: a metal oxide film is deposited in the source/drain region. It is required that the ratio between the areal density of oxygen of metal oxide and that of $GeO_2$ is less than 0.8, and the metal oxide may be strontium oxide (SrO), barium oxide (BaO), radium oxide (RaO) or the like. For example, in an embodiment of the present the metal oxide is strontium oxide (SrO). The metal oxide film may also be obtained by the ALD deposition method and has a thickness of 0.5~4 nm, as shown in FIG. 1(h).

Step 9: a metal source/drain is formed. The metal source/drain may be formed by depositing a metal film with low work function such as aluminum (Al), titanium (Ti), yttrium (Y) or the like over the semiconductor substrate by using a physical vapor deposition method such as evaporation plating or sputtering. In a preferred embodiment of the present invention, the metal film is formed with aluminum, and has a thickness of 100 nm~1 μm. The metal source/drain may be obtained by photolithography process and etching process, as shown in FIG. 1(i).

Step 10: a contact hole and a metal line are formed. Firstly, a oxide layer is deposited by CVD method, in which a hole position is defined by a photolithography process and the contact hole is formed by etching the silicon oxide; and then a metal layer such as Al layer, Al—Ti layer or the like is sputtered, and then a metal line pattern is defined by a photolithography process and the metal line is formed by etching. Finally, a metal line 10 is formed by a metallization processing, as shown in FIG. 1(j).

Embodiments of the present invention provide a Ge-based NMOS device structure and a method for fabricating the same. The method can reduce electron Schottky barrier height at the source/drain of the Ge-based schottky NMOS device, which is beneficial to improve the performance of the Ge-based Schottky NMOS transistor, and the easy fabrication process is compatible with the silicon CMOS process. As compared with conventional technology, the Ge-based NMOS device structure and the method for fabricating the same can improve the performance of the Ge-based Schottky NMOS transistor effectively.

Though the present invention is described above through preferred embodiments, those skilled in the field will understand, the embodiments described herein are only preferred examples, and a certain change or modification may be made to the device structure of the present invention without departing from the substantial scope of the present invention. For example, the source/drain structure may be lifted or recessed source/drain and other novel structure such as double gate, FinFET, Ω gate, triple gate, and surrounding gate or the like may also be used. The fabrication method is not limited to the content disclosed in the embodiment, and the equivalent changes and modifications made according to the claims of the present invention all fall into the scope of the present invention.

What is claimed is:

1. A Ge-based Schottky NMOS transistor, wherein, a germanium oxide layer and a metal oxide layer are deposited between a substrate and a source/drain region by depositing the germanium oxide layer over the substrate, depositing a metal oxide layer over the germanium oxide layer, and a metal source/drain is located over the metal oxide layer, wherein a ratio between the areal density of oxygen of metal oxide and that of $GeO_2$ is less than 0.8.

2. The Ge-based Schottky NMOS transistor according to claim 1, wherein, the germanium oxide layer has a thickness of 0.5~4 nm.

3. The Ge-based Schottky NMOS transistor according to claim 1, wherein, the metal oxide layer has a thickness of 0.5~4 nm.

4. The Ge-based Schottky NMOS transistor according to claim 1, wherein, the metal oxide is selected from strontium oxide, barium oxide or radium oxide.

5. A method for fabricating a Ge-based Schottky NMOS transistor, comprising the following steps:

1-1) fabricating a MOS structure over a Ge-based substrate;
    1-2) depositing a $GeO_2$ layer and a metal oxide layer in a source/drain region;
    1-3) sputtering a metal film with low work function, etching the metal film to form the metal source/drain; and
    1-4) forming a contact hole and a metal line, wherein a ratio between the areal density of oxygen of metal oxide and that of $GeO_2$ is less than 0.8.

6. The method according to claim 5, wherein, the step 1-1) comprises:

2-1) fabricating an isolation region over the substrate;
    2-2) depositing a gate dielectric layer and forming a gate;
    2-3) forming a gate structure; and
    2-4) forming a sidewall structure.

7. The method according to claim 5, wherein, the Ge-based substrate in the step 1-1) comprises a bulk Ge substrate, a Ge-on-insulator substrate or an epitaxial Ge substrate.

8. The method according to claim 5, wherein the metal oxide is selected from strontium oxide, barium oxide, or radium oxide.

9. The method according to claim 5, wherein, the metal film in the step 1-3) is an aluminum film or other metal film with low work function.

* * * * *